United States Patent
Xu et al.

(10) Patent No.: US 10,090,244 B2
(45) Date of Patent: Oct. 2, 2018

(54) STANDARD CELL CIRCUITS EMPLOYING HIGH ASPECT RATIO VOLTAGE RAILS FOR REDUCED RESISTANCE

(71) Applicant: QUALCOMM Incorporated, San Diego, CA (US)

(72) Inventors: Jeffrey Junhao Xu, San Diego, CA (US); Mustafa Badaroglu, Kessel-Lo (BE); Da Yang, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/634,039

(22) Filed: Jun. 27, 2017

(65) Prior Publication Data

US 2018/0033729 A1   Feb. 1, 2018

Related U.S. Application Data

(60) Provisional application No. 62/367,230, filed on Jul. 27, 2016.

(51) Int. Cl.
*H01L 23/528*     (2006.01)
*H01L 21/768*     (2006.01)
(Continued)

(52) U.S. Cl.
CPC ...... *H01L 23/5283* (2013.01); *G06F 17/5072* (2013.01); *H01L 21/76895* (2013.01);
(Continued)

(58) Field of Classification Search
CPC ........... H01L 21/76895; H01L 23/5283; H01L 23/5286; H01L 23/53257; H01L 27/0207
See application file for complete search history.

(56) References Cited

U.S. PATENT DOCUMENTS 6,838,713 B1   1/2005 Gheewala et al.
7,821,039 B2  10/2010 Tien et al.
(Continued)

FOREIGN PATENT DOCUMENTS

EP   1143520 A2   10/2001

OTHER PUBLICATIONS

Wikipedia, Electrical resistance and conductance, obtained Jan. 22, 2018, p. 1-10.*

(Continued)

*Primary Examiner* — Allan R Wilson
(74) *Attorney, Agent, or Firm* — Withrow & Terranova

(57) ABSTRACT

Standard cell circuits employing high aspect ratio voltage rails for reduced resistance are disclosed. In one aspect, a standard cell circuit is provided that employs a first high aspect ratio voltage rail configured to receive a first supply voltage. A second high aspect ratio voltage rail is employed that is disposed substantially parallel to the first high aspect ratio voltage rail. A voltage differential between the first and second high aspect ratio voltage rails is used to power a circuit device in the standard cell circuit. The first and second high aspect ratio voltage rails each have a height-to-width ratio greater than 1.0. The height of each respective first and second high aspect ratio voltage rail is greater than each respective width. Employing the first and second high aspect ratio voltage rails allows each to have a cross-sectional area that limits the resistance and corresponding IR drop.

26 Claims, 7 Drawing Sheets

(51) Int. Cl.
*H01L 23/532* (2006.01)
*H01L 27/02* (2006.01)
*G06F 17/50* (2006.01)
*H01L 27/118* (2006.01)

(52) U.S. Cl.
CPC .... *H01L 23/5286* (2013.01); *H01L 23/53209* (2013.01); *H01L 23/53252* (2013.01); *H01L 23/53257* (2013.01); *H01L 27/0207* (2013.01); *H01L 27/11807* (2013.01); *H01L 2027/11881* (2013.01)

(56) References Cited

U.S. PATENT DOCUMENTS

| | | |
|---|---|---|
| 8,336,018 B2 | 12/2012 | Turner et al. |
| 9,026,977 B2 | 5/2015 | Tarabbia et al. |
| 9,070,552 B1 | 6/2015 | Shah et al. |
| 2002/0036354 A1 | 3/2002 | Yamaguchi et al. |
| 2009/0261386 A1* | 10/2009 | Makino ............... H01L 27/0207 257/210 |
| 2010/0006990 A1* | 1/2010 | Inohara ............... H01L 23/5226 257/664 |
| 2011/0102077 A1* | 5/2011 | Lamey ............... H01L 23/4824 327/594 |
| 2012/0013019 A1* | 1/2012 | Sakamoto ........... H01L 23/5225 257/774 |
| 2012/0249182 A1 | 10/2012 | Sherlekar |
| 2016/0035676 A1* | 2/2016 | Im ..................... H01L 27/10855 257/306 |
| 2017/0117272 A1* | 4/2017 | Sio ........................ H01L 23/528 |

OTHER PUBLICATIONS

Khang, Andrew B. et al., "Interconnect Tuning Strategies for High-Performance ICs," Proceedings of Design, Automation and Test in Europe (DATA), 1998, IEEE, pp. 471-478.

Murarka, Shyam P., "Multilevel interconnections for ULSI and GSI era," Materials Science and Engineering: R: Reports, vol. 19, No. 3, 1997, pp. 87-151.

Wolf, Stanley, "Multilevel Interconnects for ULSI," Silicon Processing for the VLSI Era, vol. 4: Deep-Submicron Process Technology, vol. 4, Chapter 12.3, Jan. 2002, Lattice Press, Sunset Beach, pp. 573-602.

International Search Report and Written Opinion for PCT/US2017/039870, dated Oct. 4, 2017, 18 pages.

Second Written Opinion for PCT/US2017/039870, dated Jun. 25, 2018, 11 pages.

* cited by examiner

STANDARD CELL CIRCUITS EMPLOYING HIGH ASPECT RATIO VOLTAGE RAILS FOR REDUCED RESISTANCE

PRIORITY APPLICATION

The present application claims priority under 35 U.S.C. § 119(e) to U.S. Provisional Patent Application Ser. No. 62/367,230 filed on Jul. 27, 2016, and entitled "STANDARD CELL CIRCUITS EMPLOYING HIGH ASPECT RATIO VOLTAGE RAILS FOR REDUCED RESISTANCE," the contents of which is incorporated herein by reference in its entirety.

BACKGROUND

I. Field of the Disclosure

The technology of the disclosure relates generally to standard cell circuits, and particularly to the scaling down of voltage rails employed in standard cell circuits to reduce standard cell circuit size to increase density.

II. Background

Processor-based computer systems can include a vast array of integrated circuits (ICs). Each IC has a complex layout design comprised of multiple IC devices. Standard cell circuits are often employed to assist in making the design of ICs less complex and more manageable. In particular, standard cell circuits provide a designer with pre-designed cells corresponding to commonly used IC devices that conform to specific design rules of a chosen technology. As non-limiting examples, standard cell circuits may include gates, inverters, multiplexers, and adders. Using standard cell circuits enables a designer to create ICs having consistent layout designs, thereby creating a more uniform and less complex layout design across multiple ICs, as compared to custom designing each circuit.

Conventional standard cell circuits employ voltage rails configured to receive supply voltages, such as VDD and VSS supply voltages, which are used to power corresponding circuit devices in a standard cell circuit. For example, voltage rails can be configured to receive VDD and VSS supply voltages, wherein the voltage rails are coupled to drain and source regions of transistors within a conventional standard cell circuit such that the transistors receive the corresponding supply voltages. Voltage rails employed in conventional standard cell circuits can be sized to have a width that minimizes the resistance of the voltage rails. For example, a voltage rail formed from a conductive material with a defined resistivity has a resistance that is inversely proportional to the cross-sectional area of the voltage rail. In this manner, a voltage rail having a larger width, and thus having a larger cross-sectional area, has a smaller resistance. A lower resistance corresponds to a lower current-resistance (IR) drop (i.e., voltage drop) of each voltage rail. In this manner, a higher percentage of voltage is provided to each circuit device such that the performance of the standard cell circuit increases, wherein the performance is inversely correlated to the IR drop.

The width of signal lines and/or voltage rails in the standard cell circuits are scaled down to decrease the size of the standard cell circuits. However, because the signal lines and voltage rails are formed from metal (i.e., a conductive material), a decrease in width of such signal lines and voltage rails results in a decrease in cross-sectional area that causes an increase in resistance. For example, signal lines and/or voltage rails formed from a metal, such as copper (Cu), experience an increase in resistance as the width, and thus the cross-sectional area, decreases. Additionally, signal lines and/or voltage rails formed from copper (Cu) require a layer of copper (Cu) barrier and liner. Such barrier and liner layers limit the cross-sectional area available for the actual copper (Cu) signal line and/or voltage rail, thus reducing the area available for current flow and causing an even higher resistance. Alternatively, metals that may not need a barrier and/or liner layer such as aluminum (Al), cobalt (Co), or ruthenium (Ru) may be employed instead of copper (Cu), wherein the absence of a barrier and/or liner layer provides more cross-sectional area available for the signal line and/or voltage rail, thus limiting an increase in resistance attributable to reduced cross-sectional area of the conductive material. However, such metals have a higher resistivity, and thus a higher resistance than copper (Cu) at a conventional voltage rail width, resulting in a higher IR drop compared to copper (Cu). Higher IR drops in voltage rails may reduce voltage delivered by the voltage rail to a voltage level below circuit activation voltage levels (e.g., threshold voltages) that can unintendedly prevent activation of circuit elements, thus causing the standard cell circuit to produce erroneous output.

SUMMARY OF THE DISCLOSURE

Aspects disclosed herein include standard cell circuits employing high aspect ratio voltage rails for reduced resistance. In one aspect, a standard cell circuit is provided. As used herein, a standard cell circuit is a collection of circuit devices that provides an integrated circuit (IC) function and that conforms to specific design rules of a chosen fabrication technology. The standard cell circuit employs a first high aspect ratio voltage rail configured to receive a first supply voltage (e.g., VDD). The standard cell circuit also employs a second high aspect ratio voltage rail extending substantially parallel to the first high aspect ratio voltage rail that may be configured to receive a second supply voltage (e.g., VSS) or coupled to ground. In this manner, a voltage differential between the first and second high aspect ratio voltage rails is used to power a circuit device in the standard cell circuit. As used herein, a high aspect ratio is a height-to-width ratio greater than 1.0, wherein the first and second high aspect ratio voltage rails each have a height-to-width ratio greater than 1.0. In other words, the height of the first high aspect ratio voltage rail is greater than the width of the first high aspect ratio voltage rail. Similarly, the height of the second high aspect ratio voltage rail is greater than the width of the second high aspect ratio voltage rail. Employing the first and second high aspect ratio voltage rails with a greater height than width in this manner allows each of the first and second high aspect ratio voltage rails to have a cross-sectional area large enough to achieve a lower resistance corresponding to a particular, lower current-resistance (IR) drop (i.e., voltage drop) compared to voltage rails of a similar width but which do not have a high aspect ratio. Thus, even if a metal material with a relatively higher resistivity is employed for first and second high aspect ratio voltage rails in a standard cell circuit, the first and second high aspect ratio voltage rails can be designed to each have a cross-sectional area that limits the resistance and corresponding IR drop to reduce or avoid errors in the standard cell circuit resulting from unintended reduced voltages levels due to IR drop energy losses.

In this regard in one aspect, a standard cell circuit is provided. The standard cell circuit comprises a first high aspect ratio voltage rail extending along a first longitudinal axis in a first direction. The first high aspect ratio voltage rail has a height-to-width ratio greater than 1.0 and is configured to receive a first supply voltage. The standard cell circuit further comprises a second high aspect ratio voltage rail extending along a second longitudinal axis in the first direction substantially parallel to the first high aspect ratio voltage rail. The second high aspect ratio voltage rail has a height-to-width ratio greater than 1.0. The standard cell circuit further comprises a circuit device electrically coupled to the first high aspect ratio voltage rail and the second high aspect ratio voltage rail, wherein a voltage differential between the first high aspect ratio voltage rail and the second high aspect voltage rail provides power to the circuit device.

In another aspect, a standard cell circuit is provided. The standard cell circuit comprises a means for providing a first supply voltage to the standard cell circuit extending along a first longitudinal axis in a first direction. The means for providing the first supply voltage has a height-to-width ratio greater than 1.0. The standard cell circuit further comprises a means for providing a second supply voltage to the standard cell circuit extending along a second longitudinal axis in the first direction substantially parallel to the means for providing the first supply voltage. The means for providing the second supply voltage has a height-to-width ratio greater than 1.0. The standard cell circuit further comprises a means for providing a circuit function electrically coupled to the means for providing the first supply voltage and the means for providing the second supply voltage, wherein a voltage differential between the means for providing the first supply voltage and the means for providing the second supply voltage provides power to the means for providing the circuit function.

In another aspect, a method for manufacturing a standard cell circuit employing high aspect ratio voltage rails for reduced resistance is provided. The method comprises disposing a first high aspect ratio voltage rail along a first longitudinal axis in a first direction, wherein the first high aspect ratio voltage rail has a height-to-width ratio greater than 1.0 and is configured to receive a first supply voltage. The method further comprises disposing a second high aspect ratio voltage rail extending along a second longitudinal axis in the first direction substantially parallel to the first high aspect ratio voltage rail. The second high aspect ratio voltage rail has a height-to-width ratio greater than 1.0. The method further comprises forming a circuit device that is electrically coupled to the first high aspect ratio voltage rail and the second high aspect ratio voltage rail, wherein a voltage differential between the first high aspect ratio voltage rail and the second high aspect ratio voltage rail provides power to the circuit device.

DETAILED DESCRIPTION

Figure 1A:
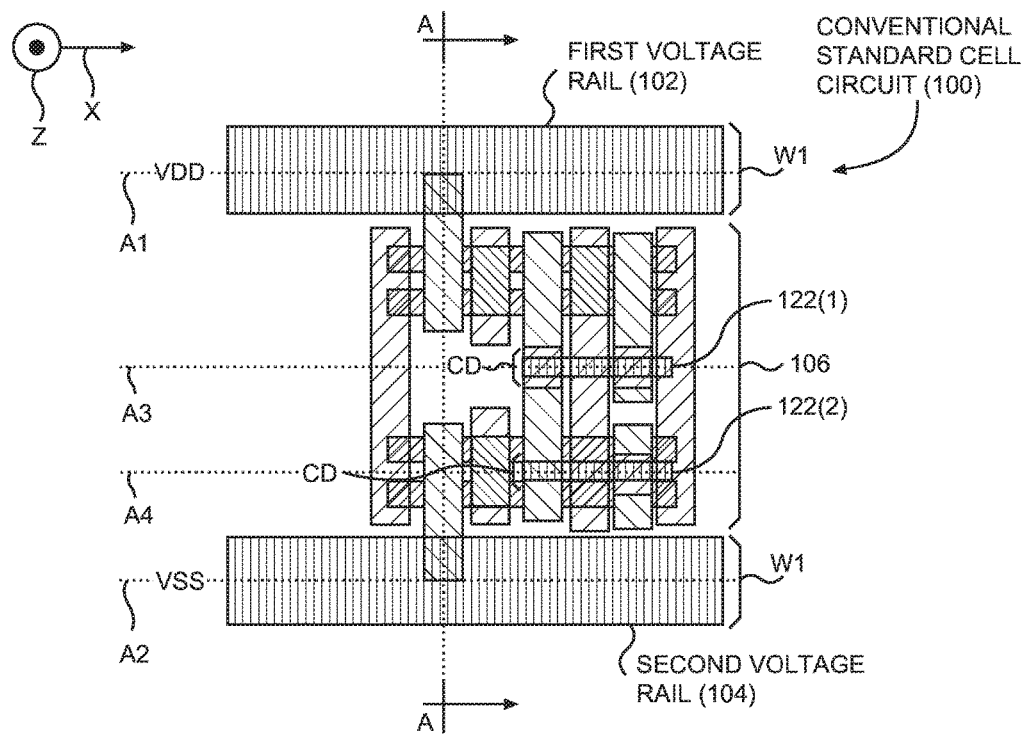
FIG. 1A is a top-view diagram of a conventional standard cell circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include standard cell circuits employing high aspect ratio voltage rails for reduced resistance. In one aspect, a standard cell circuit is provided. As used herein, a standard cell circuit is a collection of circuit devices that provides an integrated circuit (IC) function and that conforms to specific design rules of a chosen fabrication technology. The standard cell circuit employs a first high aspect ratio voltage rail configured to receive a first supply voltage (e.g., VDD). The standard cell circuit also employs a second high aspect ratio voltage rail extending substantially parallel to the first high aspect ratio voltage rail that may be configured to receive a second supply voltage (e.g., VSS) or coupled to ground. In this manner, a voltage differential between the first and second high aspect ratio voltage rails is used to power a circuit device in the standard cell circuit. As used herein, a high aspect ratio is a height-to-width ratio greater than 1.0, wherein the first and second high aspect ratio voltage rails each have a height-to-width ratio greater than 1.0. In other words, the height of the first high aspect ratio voltage rail is greater than the width of the first high aspect ratio voltage rail. Similarly, the height of the second high aspect ratio voltage rail is greater than the width of the second high aspect ratio voltage rail. Employing the first and second high aspect ratio voltage rails with a greater height than width in this manner allows each of the first and second high aspect ratio voltage rails to have a cross-sectional area large enough to achieve a lower resistance corresponding to a particular, lower current-resistance (IR) drop (i.e., voltage drop) compared to voltage rails of a similar width but which do not have a high aspect ratio. Thus, even if a metal material with a relatively higher resistivity is employed for first and second high aspect ratio voltage rails in a standard cell circuit, the first and second high aspect ratio voltage rails can be designed to each have a cross-sectional area that limits the resistance and corresponding IR drop to reduce or avoid errors in the standard cell circuit resulting from unintended reduced voltages levels due to IR drop energy losses.

Figure 1B:
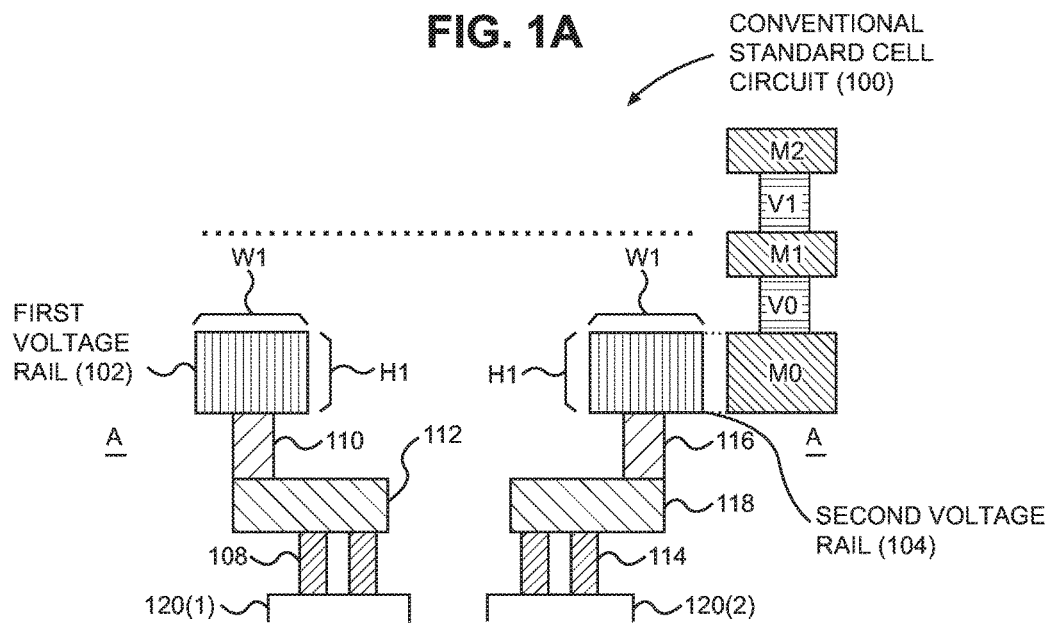
FIG. 1B is a cross-sectional diagram of the standard cell circuit taken generally along line A-A in FIG. 1A.
Figure 2A:
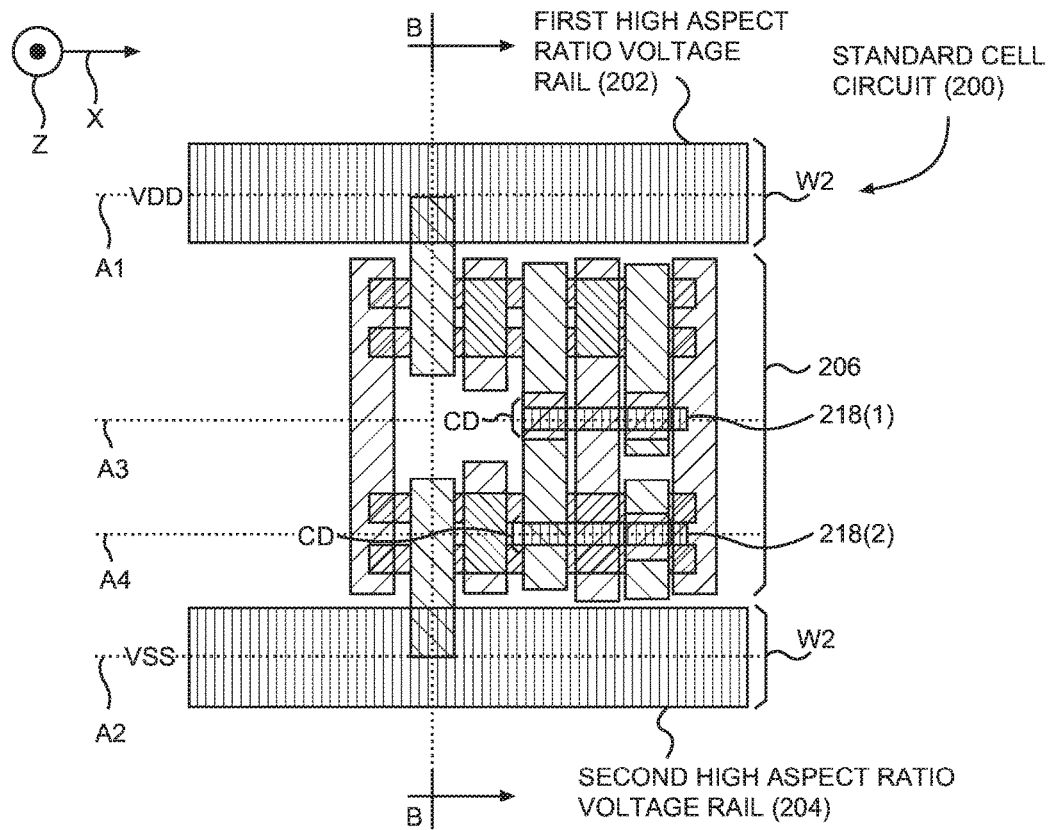
FIG. 2A is a top-view diagram of an exemplary standard cell circuit employing high aspect ratio voltage rails for reduced resistance for reducing current-resistance (IR) drop.

Before discussing a standard cell circuit employing high aspect ratio voltage rails for reduced resistance for reducing IR drop beginning in FIG. 2A, a conventional standard cell circuit is first described. In this regard, FIGS. 1A and 1B illustrate a conventional standard cell circuit 100 employing standard voltage rails. FIG. 1A illustrates a top-view diagram of the conventional standard cell circuit 100, while FIG. 1B illustrates a cross-sectional view of the conventional standard cell circuit 100 taken generally along line A-A in FIG. 1A.

With reference to FIGS. 1A and 1B, the conventional standard cell circuit 100 includes first voltage rail 102 extending along a first longitudinal axis A1 in a first direction X. The conventional standard cell circuit 100 also includes a second voltage rail 104 extending along a second longitudinal axis A2 in the first direction X substantially parallel to the first voltage rail 102. The conventional standard cell circuit 100 also includes a circuit device 106 formed from multiple circuit elements (e.g., transistor elements) disposed below the first and second voltage rails 102, 104 in a second direction Z. Further, a voltage differential between the first and second voltage rails 102, 104 is used to power the circuit device 106. For example, the first voltage rail 102 may receive a first supply voltage (e.g., VDD), while the second voltage rail 104 may receive a second supply voltage (e.g., VSS) or be coupled to ground. Further, connection elements within the conventional standard cell circuit 100 may be employed to distribute the first and second supply voltages VDD, VSS from the first and second voltage rails 102, 104 to the circuit device 106. In particular, the first voltage rail 102 is electrically coupled to a first power input 108 by way of a via 110 and a contact layer interconnect 112. Additionally, the second voltage rail 104 is electrically coupled to a second power input 114 by way of a via 116 and a contact layer interconnect 118. The first and second power inputs 108, 114 are electrically coupled to corresponding elements 120(1), 120(2) of the circuit device 106 so as to distribute the first and second supply voltages VDD, VSS to the circuit device 106.

With continuing reference to FIGS. 1A and 1B, the first and second voltage rails 102, 104 each have a width W1 approximately equal to three (3) times a width of metal lines in the conventional standard cell circuit 100, such as metal lines 122(1), 122(2) extending along axes A3, A4, respectively, along the first direction X substantially parallel to the first and second voltage rails 102, 104. In this manner, the width of the metal lines 122(1), 122(2) may be approximately equal to a critical dimension (CD) of a process technology used to fabricate the conventional standard cell circuit 100. As used herein, the critical dimension (CD) of a process technology is the smallest width in which a metal line can be fabricated in the process technology while still satisfying corresponding design rules so as to avoid erroneous circuit function. Additionally, the first and second voltage rails 102, 104 each have a height H1 that is less than the width W1. In this manner, a height-to-width ratio of the first and second voltage rails 102, 104 is less than 1.0 (i.e., height-to-width ratio (H1:W1)<1). In this example, because the first and second voltage rails 102, 104 each have a height H1 such that each corresponds to a metal layer M0, vias in a via level V0, interconnects in a metal layer M1, and vias in a via level V1 would need to be employed to electrically couple the first and second voltage rails 102, 104, respectively, to routing interconnects in a metal layer M2 so as to route the first and second supply voltages VDD, VSS throughout the conventional standard cell circuit 100. It is worth noting that elements used to electrically couple the first and second voltage rails 102, 104 to routing interconnects in the metal layer M2 add corresponding resistance to the conventional standard cell circuit 100, thus increasing IR drop and reducing performance.

With continuing reference to FIGS. 1A and 1B, the IR drop of the first and second voltage rails 102, 104 is also affected by a resistivity of the material used to form the first and second voltage rails 102, 104, as well as the width W1 and height H1. In this manner, the first and second voltage rails 102, 104 may be employed using a metal more scalable than copper (Cu), such as ruthenium (Ru) or cobalt (Co). However, if the more scalable metals have a higher resistivity than copper (Cu), employing the first and second voltage rails 102, 104 using such metals results in the first and second voltage rails 102, 104 each having a higher resistance as compared to using copper (Cu). Further, reducing the width W1 to decrease area consumption of the standard cell circuit 100 reduces the conductive area of the first and second voltage rails 102, 104, which further increases the resistance, and thus the IR drop, of the first and second voltage rails 102, 104. An increased IR drop can reduce the voltage distributed by the first and second voltage rails 102, 104 to a level low enough to prevent activation of the circuit device 106, thus causing the conventional standard cell circuit 100 to produce erroneous output resulting from unintended reduced voltages levels due to IR drop energy losses.

Figure 2B:
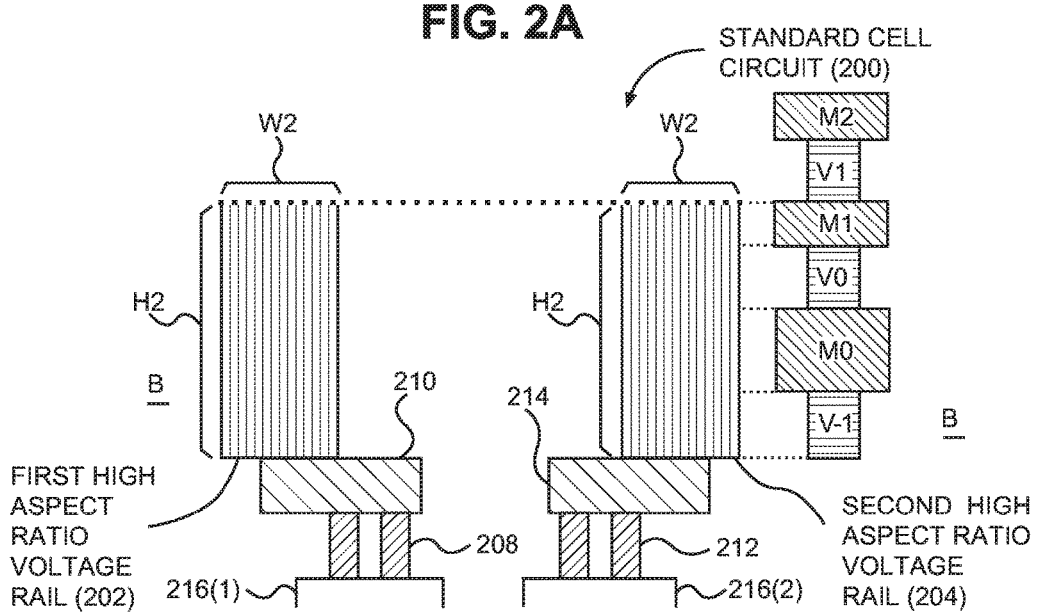
FIG. 2B is a cross-sectional diagram of the standard cell circuit taken generally along line B-B in FIG. 2A employing high aspect ratio voltage rails for reduced resistance for reducing IR drop.

In this regard, FIGS. 2A and 2B illustrate an exemplary standard cell circuit 200 employing high aspect ratio voltage rails for reduced resistance for reducing IR drop. FIG. 2A illustrates a top-view diagram of the standard cell circuit 200, while FIG. 2B illustrates a cross-sectional view of the standard cell circuit 200 taken generally along line B-B in FIG. 2A.

With reference to FIGS. 2A and 2B, the standard cell circuit 200 employs a first high aspect ratio voltage rail 202 extending along a first longitudinal axis A1 in a first direction X and configured to receive a first supply voltage (e.g., VDD). The standard cell circuit 200 also employs a second high aspect ratio voltage rail 204 extending along a second longitudinal axis A2 in the first direction X substantially parallel to the first high aspect ratio voltage rail 202. The second high aspect ratio voltage rail 204 may be configured to receive a second supply voltage (e.g., VSS) or be coupled to ground. In this manner, a voltage differential between the first and second high aspect ratio voltage rails 202, 204 is used to power the circuit device 206 in the standard cell circuit 200. For example, the first and second high aspect ratio voltage rails 202, 204 are configured to receive the first supply voltage VDD and the second supply voltage VSS, respectively, and distribute the first and second supply voltages VDD, VSS to the circuit device 206 formed from multiple circuit elements (e.g., transistor elements) disposed below the first and second high aspect ratio voltage rails 202, 204 in a second direction Z. In this aspect, the first high aspect ratio voltage rail 202 is electrically coupled to a first power input 208 by way of a contact layer interconnect 210, and the second high aspect ratio voltage rail 204 is electrically coupled to a second power input 212 by way of a contact layer interconnect 214. The first and second power inputs 208, 212 are electrically coupled to corresponding elements 216(1), 216(2) of the circuit device 206 so as to distribute the first and second supply voltages VDD, VSS to the circuit device 206.

With continuing reference to FIGS. 2A and 2B, the first and second high aspect ratio voltage rails 202, 204 each have a width W2 approximately equal to three (3) times a width of a metal line of one or more metal lines in a metal layer in the standard cell circuit 200, such as metal lines 218(1), 218(2) extending along axes A3, A4, respectively, along the first direction X substantially parallel to the first and second high aspect ratio voltage rails 202, 204. As illustrated in FIG. 2A, the longitudinal axes A3, A4 are different from the first and second longitudinal axes A1, A2. The width of the metal lines 218(1), 218(2) may be approximately equal to a critical dimension (CD) of a process technology used to fabricate the standard cell circuit 200. Further, the first and second high aspect ratio voltage rails 202, 204 each have a height-to-width ratio greater than 1.0. More specifically, a height H2 of the first high aspect ratio voltage rail 202 is greater than the width W2 of the first high aspect ratio voltage rail 202. Similarly, the height H2 of the second high aspect ratio voltage rail 204 is greater than the width W2 of the second high aspect ratio voltage rail 204. In this example, the height H2 is two (2) times the width W2 such that the height-to-width ratio of the first and second high aspect ratio voltage rails 202, 204 is equal to two (2). As a result, the first and second high aspect ratio voltage rails 202, 204 each extend from a metal layer M0 into a via level V0 and a metal layer M1. In other words, due to the height H2 of the first and second high aspect ratio voltage rails 202, 204, elements in the via level V0 and the metal layer M1 are not needed in addition to vias in a via level V1 to electrically couple the first and second high aspect ratio voltage rails 202, 204 to routing interconnects in a metal layer M2. Additionally, in this aspect, elements in a via level V−1 below the metal layer M0 are not needed to couple the first and second high aspect ratio voltage rails 202, 204 to the corresponding contact layer interconnects 210, 214.

With continuing reference to FIGS. 2A and 2B, the absence of elements in the via levels V−1 and V0, and the metal layer M1 reduces the resistance of the standard cell circuit 200, which reduces the IR drop and increases performance compared to the conventional standard cell circuit 100 in FIGS. 1A and 1B. Additionally, employing the first and second high aspect ratio voltage rails 202, 204 with a greater height H2 than width W2 in this manner allows each to have a cross-sectional area large enough to achieve a relatively lower resistance corresponding to a particular IR drop (e.g., voltage drop). Thus, even if a metal with a higher resistivity than copper (Cu) is employed, such as ruthenium (Ru) or cobalt (Co), for example, the first and second high aspect ratio voltage rails 202, 204 can be designed to each have a height H2 such that the resulting cross-sectional area limits the resistance and corresponding IR drop to reduce or avoid errors in the standard cell circuit 200 resulting from unintended reduced voltages levels due to IR drop energy losses.

Figure 3:
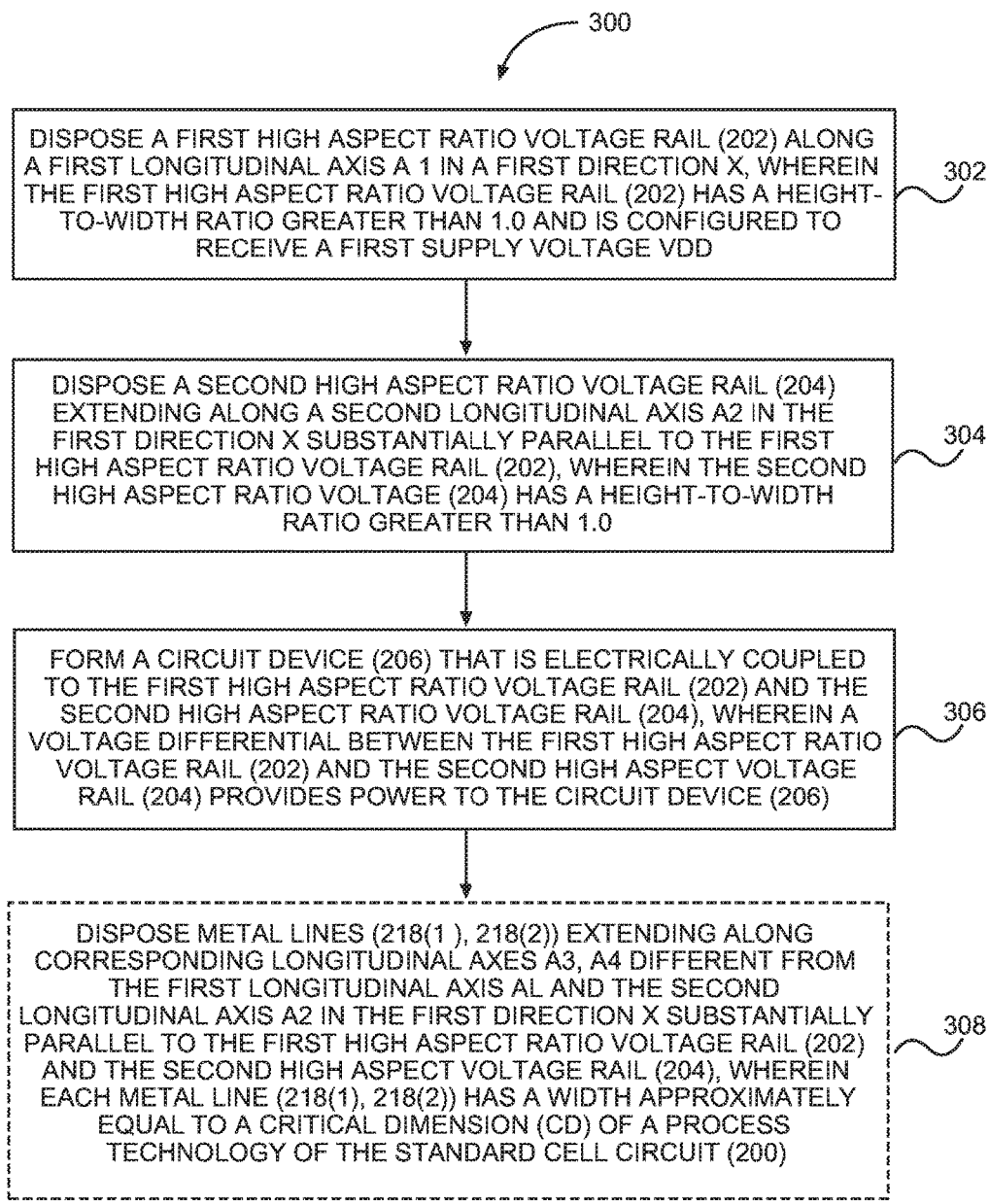
FIG. 3 is a flowchart illustrating an exemplary process of fabricating the standard cell circuit employing high aspect ratio voltage rails for reduced resistance for reducing IR drop in FIGS. 2A-2B.

FIG. 3 illustrates an exemplary fabrication process 300 for the standard cell circuit 200 employing the first and second high aspect ratio voltage rails 202, 204 for reduced resistance in FIGS. 2A-2B. The fabrication process 300 includes disposing the first high aspect ratio voltage rail 202 along the first longitudinal axis A1 in the first direction X, wherein the first high aspect ratio voltage rail 202 has a height-to-width ratio greater than 1.0 and is configured to receive the first supply voltage (e.g., VDD) (block 302). The fabrication process 300 also includes disposing the second high aspect ratio voltage rail 204 extending along the second longitudinal axis A2 in the first direction X substantially parallel to the first high aspect ratio voltage rail 202 (block 304). The second high aspect ratio voltage rail 204 has a height-to-width ratio greater than 1.0. The fabrication process 300 also includes forming the circuit device 206 that is electrically coupled to the first high aspect ratio voltage rail 202 and the second high aspect ratio voltage rail 204 (block 306). The voltage differential between the first high aspect ratio voltage rail 202 and the second high aspect voltage rail 204 provides power to the circuit device 206. Additionally, the fabrication process 300 can include steps to employ the metal lines 218(1), 218(2). For example, the fabrication process 300 can include disposing the metal lines 218(1), 218(2) along the corresponding longitudinal axes A3, A4, in the first direction X substantially parallel to the first and second high aspect ratio voltage rails 202, 204, wherein each metal line 218(1), 218(2) has a width approximately equal to the critical dimension (CD) of the process technology of the standard cell circuit 200 (block 308). As discussed above, the first and second high aspect ratio voltage rails 202, 204 can each have a width W2 approximately equal to three (3) times the width (e.g., CD) of the metal lines 218(1), 218(2), two (2) times the width (e.g., CD) of the metal lines 218(1), 218(2), approximately equal to the width (e.g., CD) of the metal lines 218(1), 218(2), or of any value in a range between width (e.g., CD) of the metal lines 218(1), 218(2) and three (3) times the width (e.g., CD).

Figures 4A, 4B:
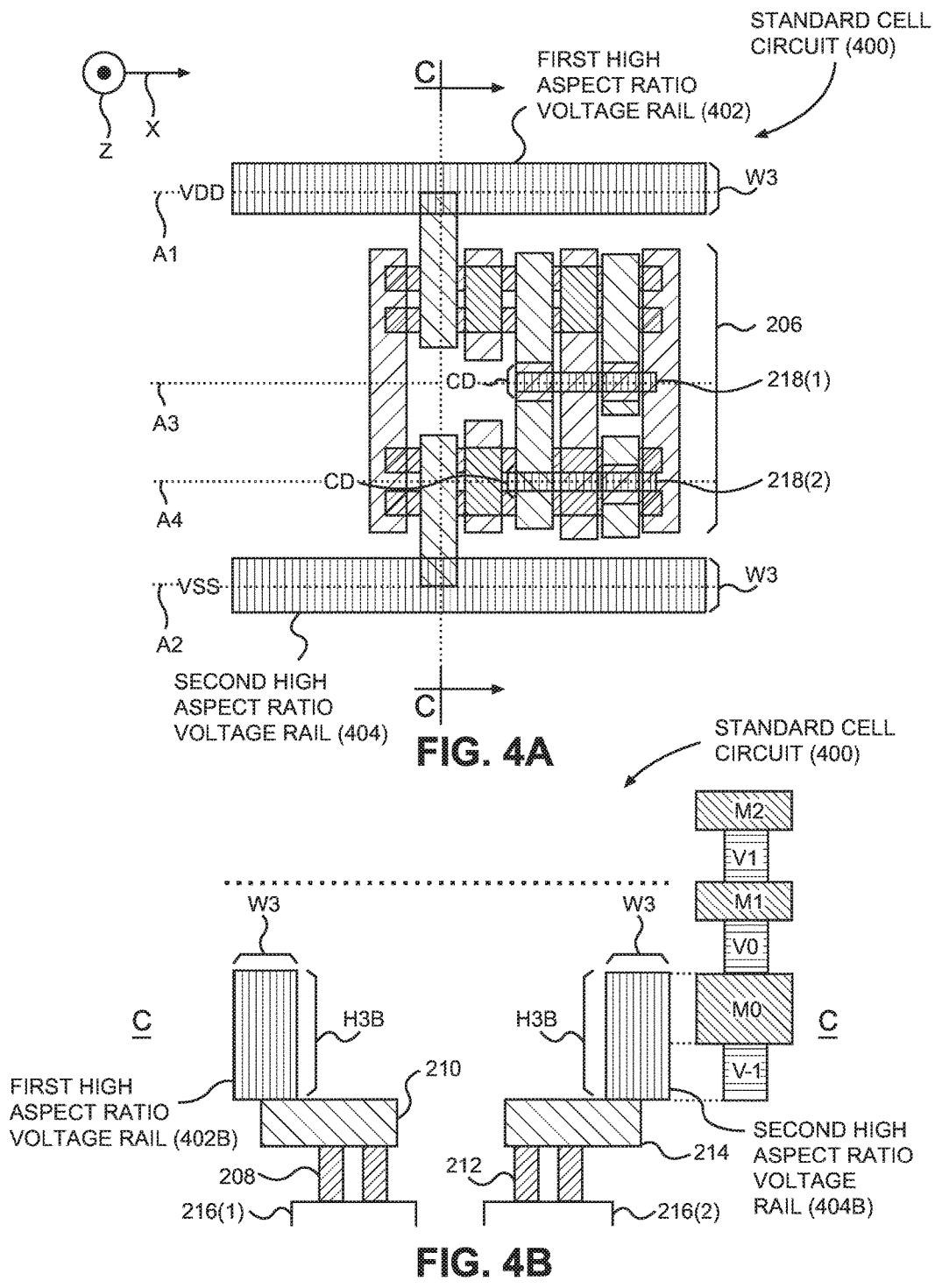
FIG. 4A is a top-view diagram of another exemplary standard cell circuit employing high aspect ratio voltage rails for reduced resistance for reducing IR drop.
FIG. 4B is an exemplary cross-sectional diagram of the standard cell circuit taken generally along line C-C in FIG. 4A employing high aspect ratio voltage rails with a height-to-width ratio approximately equal to 2.0.
Figure 4C:
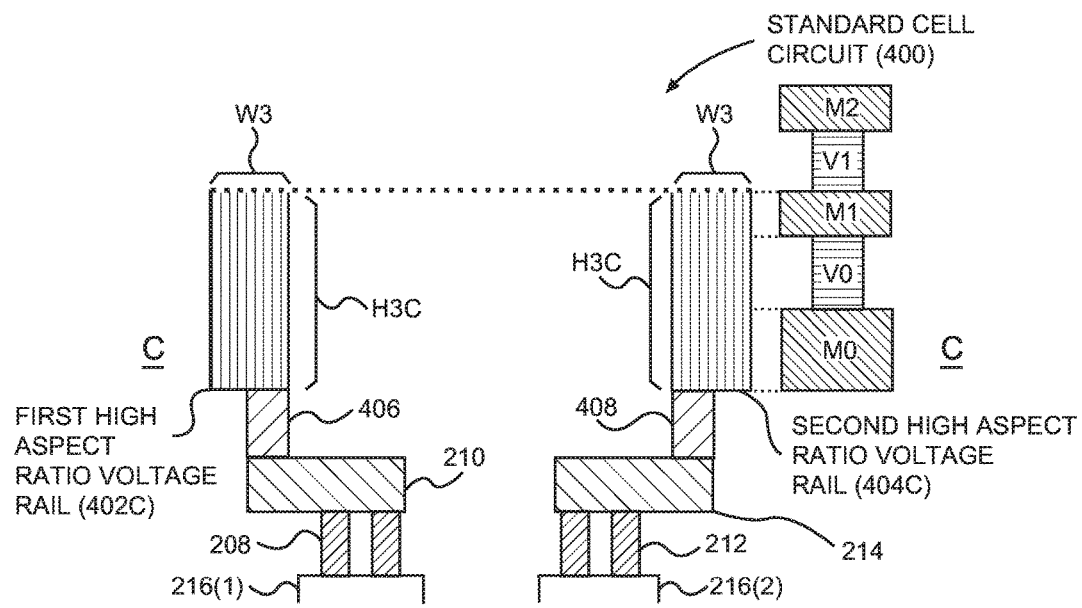
FIG. 4C is another exemplary cross-sectional diagram of the standard cell circuit taken generally along line C-C in FIG. 4A employing high aspect ratio voltage rails with a height-to-width ratio approximately equal to 3.0.
Figure 4D:
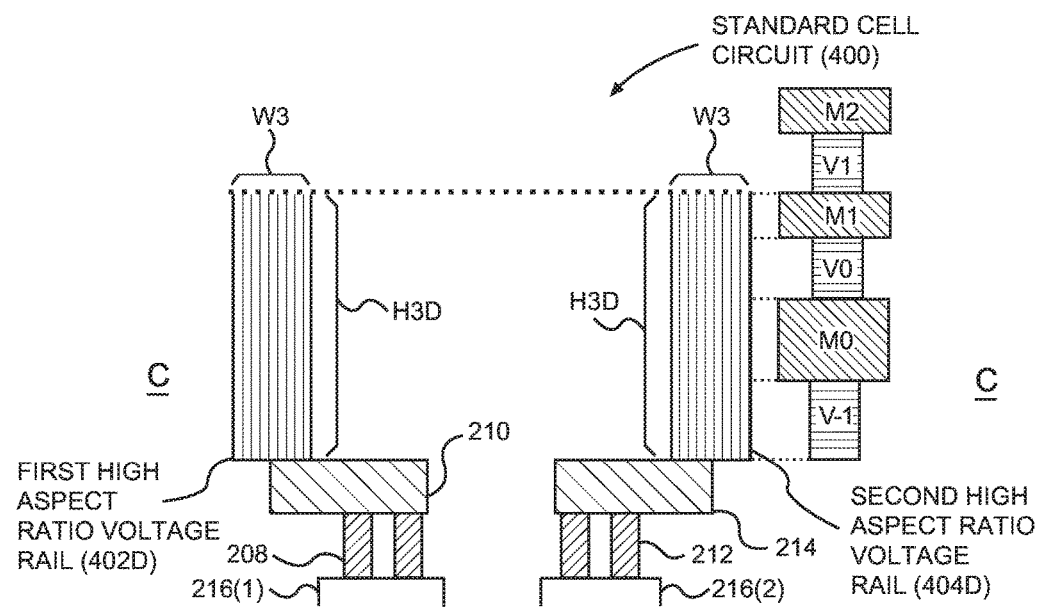
FIG. 4D is another exemplary cross-sectional diagram of the standard cell circuit taken generally along line C-C in FIG. 4A employing high aspect ratio voltage rails with a height-to-width ratio approximately equal to four (4)

In addition to the standard cell circuit 200 in FIGS. 2A and 2B, other aspects may employ high aspect ratio voltage rails with a reduced width to reduce area consumption while also achieving a reduction in resistance. In this regard, FIGS. 4A-4D illustrate an exemplary standard cell circuit 400 employing high aspect ratio voltage rails for reduced resistance. FIG. 4A illustrates a top-view diagram of the standard cell circuit 400, while FIGS. 4B-4D illustrate cross-sectional views of different instances of the standard cell circuit 400 taken generally along line C-C in FIG. 4A. As discussed in further detail below, FIGS. 4A-4D each illustrate the standard cell circuit 400 employing high aspect ratio voltage rails at varying heights according to particular design choices. Further, the standard cell circuit 400 includes certain common components with the standard cell circuit 200 in FIGS. 2A and 2B, as shown by similar element numbers between FIGS. 2A, 2B, and 4A-4D, and thus will not be re-described herein.

With reference to FIGS. 4A-4D, the standard cell circuit 400 employs a first high aspect ratio voltage rail 402 extending along a first longitudinal axis A1 in a first direction X and configured to receive a first supply voltage (e.g., VDD). The standard cell circuit 400 also employs a second high aspect ratio voltage rail 404 extending along a second longitudinal axis A2 in the first direction X substantially parallel to the first high aspect ratio voltage rail 402. The second high aspect ratio voltage rail 404 may be configured to receive a second supply voltage (e.g., VSS) or be coupled to ground. In this manner, a voltage differential between the first and second high aspect ratio voltage rails 402, 404 is used to power the circuit device 206 in the standard cell circuit 400. The first and second high aspect ratio voltage rails 402B, 402D, 404B, 404D in the aspects illustrated in FIGS. 4B and 4D are electrically coupled to the first and second power inputs 208, 212 by way of the contact layer interconnects 210, 214, respectively. However, the first and second high aspect ratio voltage rails 402C, 404C in the aspect illustrated in FIG. 4C are electrically coupled to the first and second power inputs 208, 212 by way of vias 406, 408 and the contact layer interconnects 210, 214, respectively.

With continuing reference to FIG. 4A, the first and second high aspect ratio voltage rails 402, 404 each have a width W3 less than three (3) times a critical dimension (CD) (e.g., width) of a metal line of one or more metal lines disposed in a metal layer in the standard cell circuit 400, such as the metal lines 218(1), 218(2). In this example, the width W3 is approximately equal to two (2) times the critical dimension (CD) of the metal lines 218(1), 218(2). For example, if the standard cell circuit 400 has a metal line pitch approximately equal to twenty-eight (28) nanometers (nm), the critical dimension (CD) of the metal line 218(1) may be approximately equal to fourteen (14) nm. Thus, the width W3 is approximately equal to 28 nm. However, other aspects may employ the first and second high aspect ratio voltage rails 402, 404 having a width approximately equal to the critical dimension (CD) (e.g., 14 nm).

With reference to FIGS. 4B-4D, the first and second high aspect ratio voltage rails 402B-402D, 404B-404D can be designed with different heights according to design specifications of a particular instance of the standard cell circuit 400. To distinguish between each instance of the first and second high aspect ratio voltage rails 402, 404 in FIG. 4B-4D, a B, C, or D is appended to the element number in FIGS. 4B-4D, respectively.

In this regard, with particular reference to FIG. 4B, a height H3B of the first and second high aspect ratio voltage rails 402B, 404B is two (2) times the width W3, such that the height-to-width ratio of the first and second high aspect ratio voltage rails 402B, 404B is equal to two (2). Because the first and second high aspect ratio voltage rails 402B, 404B have a height H3B, vias in a via level V0 and interconnects in a metal layer M1 would be needed in addition to vias in a via level V1 to electrically couple the first and second high aspect ratio voltage rails 402B, 404B to routing interconnects in a metal layer M2. Alternatively, with particular reference to FIG. 4C, a height H3C of the first and second high aspect ratio voltage rails 402C, 404C is three (3) times the width W3, such that the height-to-width ratio of the first and second high aspect ratio voltage rails 402C, 404C is equal to three (3). Because the first and second high aspect ratio voltage rails 402C, 404C have a height H3C, no elements in the via level V0 and the metal layer M1 would be needed in addition to vias in the via level V1 to electrically couple the first and second high aspect ratio voltage rails 402C, 404C to routing interconnects in the metal layer M2. Additionally, with particular reference to FIG. 4D, a height H3D of the first and second high aspect ratio voltage rails 402D, 404D is four (4) times the width W3, such that the height-to-width ratio of the first and second high aspect ratio voltage rails 402D, 404D is equal to four (4). Because the first and second high aspect ratio voltage rails 402D, 404D have a height H3D, no elements in the via level V0 and the metal layer M1 would be needed in addition to vias in the via level V1 to electrically couple the first and second high aspect ratio voltage rails 402D, 404D to routing interconnects in the metal layer M2.

Although each instance of the standard cell circuit 400 illustrated in FIGS. 4A-4D includes differing attributes, employing the first and second high aspect ratio voltage rails 402, 404 with the width W3 less than three (3) times the critical dimension (CD) and the height-to-width ratio of greater than 1.0 in this manner reduces the footprint of the standard cell circuit 400. Additionally, employing the first and second high aspect ratio voltage rails 402, 404 with the height-to-width ratio of greater than 1.0 allows the first and second high aspect ratio voltage rails 402, 404 to have a cross-sectional area large enough to achieve a resistance corresponding to a particular IR drop. Thus, even with the reduced width W3 and/or a metal with a relatively high resistivity, such as ruthenium (Ru) or cobalt (Co), for example, the first and second high aspect ratio voltage rails 402, 404 can be designed to each have a respective height H3B, H3C, H3D that minimizes the corresponding IR drop to reduce or avoid errors in the standard cell circuit 400, while also limiting area consumption.

Additionally, with continuing reference to FIGS. 4A-4D, the standard cell circuit 400 also avoids the need to employ copper (Cu) for the first and second high aspect ratio voltage rails 402, 404 to achieve a particular IR drop, while using an alternative, more scalable metal for other portions of the standard cell circuit 400. Instead, the standard cell circuit 400 may employ a single metal for the first and second high aspect ratio voltage rails 402, 404, as well as for other portions of the standard cell circuit 400 and still achieve a desired IR drop due to the height-to-width ratio of the first and second high aspect ratio voltage rails 402, 404 being greater than 1.0. More specifically, the standard cell circuit 400 may employ a metal that is more scalable than copper (Cu) for the first and second high aspect ratio voltage rails 402, 404 and other portions of the standard cell circuit 400 (e.g., the metal lines 218(1), 218(2)) even if such a metal has a higher resistivity than copper (Cu), because of the reduced resistance achieved by the height-to-width ratio of greater than 1.0. Employing a single metal in this manner allows the standard cell circuit 400 to be fabricated with limited process complexity and wafer costs.

The elements described herein are sometimes referred to as means for performing particular functions. In this regard, the first high aspect ratio voltage rails 202, 402 are sometimes referred to herein as "a means for providing a first supply voltage to the standard cell circuit extending along a first longitudinal axis in a first direction, wherein the means for providing the first supply voltage has a height-to-width ratio greater than 1.0." Additionally, the second high aspect ratio voltage rails 204, 404 are sometimes referred to herein as "a means for providing a second supply voltage to the standard cell circuit extending along a second longitudinal axis in the first direction substantially parallel to the means for providing the first supply voltage, wherein the means for providing the second supply voltage has a height-to-width ratio greater than 1.0." The circuit device 206 is sometimes referred to herein as "a means for providing a circuit function electrically coupled to the means for providing the first supply voltage and the means for providing the second supply voltage, wherein a voltage differential between the means for providing the first supply voltage and the means for providing the second supply voltage provides power to the means for providing the circuit function."

The standard cell circuits employing high aspect ratio voltage rails for reduced resistance according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 5:
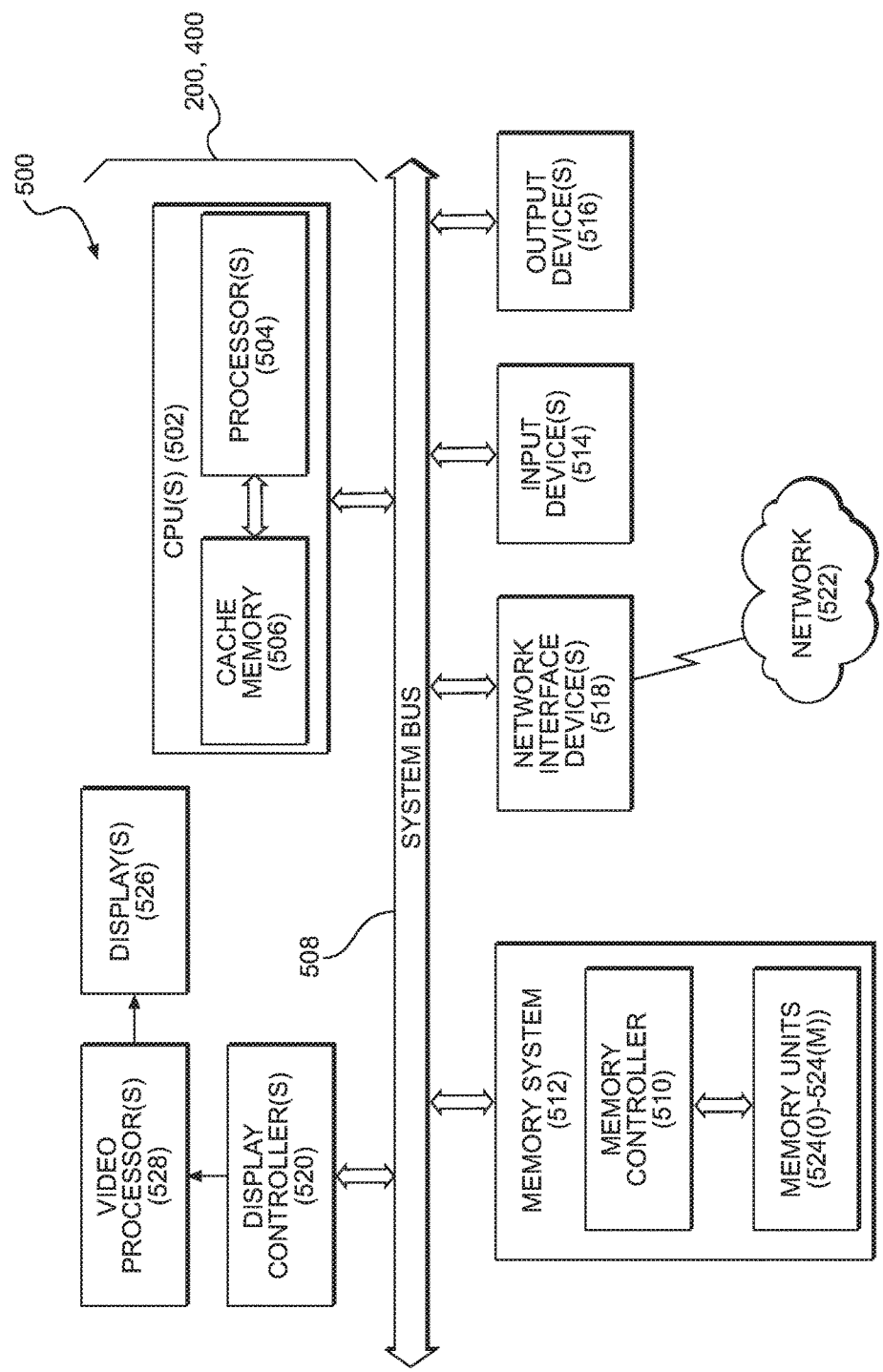
FIG. 5 is a block diagram of an exemplary processor-based system that can include elements employing the standard cell circuits employing high aspect ratio voltage rails for reduced resistance for reducing IR drop in FIGS. 2A-2B and 4A-4D.

In this regard, FIG. 5 illustrates an example of a processor-based system 500 that can include elements employing the standard cell circuits 200, 400 employing the high aspect ratio voltage rails 202, 204, 402, 404 for reduced resistance in FIGS. 2A-2B and 4A-4D, respectively. In this example, the processor-based system 500 includes one or more central processing units (CPUs) 502, each including one or more processors 504. The CPU(s) 502 may have cache memory 506 coupled to the processor(s) 504 for rapid access to temporarily stored data. The CPU(s) 502 is coupled to a system bus 508 and can intercouple master and slave devices included in the processor-based system 500. As is well known, the CPU(s) 502 communicates with these other devices by exchanging address, control, and data information over the system bus 508. For example, the CPU(s) 502 can communicate bus transaction requests to a memory controller 510 as an example of a slave device. Although not illustrated in FIG. 5, multiple system buses 508 could be provided, wherein each system bus 508 constitutes a different fabric.

Other master and slave devices can be connected to the system bus 508. As illustrated in FIG. 5, these devices can include a memory system 512, one or more input devices 514, one or more output devices 516, one or more network interface devices 518, and one or more display controllers 520, as examples. The input device(s) 514 can include any type of input device, including but not limited to input keys, switches, voice processors, etc. The output device(s) 516 can include any type of output device, including but not limited to audio, video, other visual indicators, etc. The network interface device(s) 518 can be any device configured to allow exchange of data to and from a network 522. The network 522 can be any type of network, including but not limited to a wired or wireless network, a private or public network, a local area network (LAN), a wireless local area network (WLAN), a wide area network (WAN), a BLUETOOTH™ network, or the Internet. The network interface device(s) 518 can be configured to support any type of communications protocol desired. The memory system 512 can include one or more memory units 524(0)-524(M).

The CPU(s) 502 may also be configured to access the display controller(s) 520 over the system bus 508 to control information sent to one or more displays 526. The display controller(s) 520 sends information to the display(s) 526 to be displayed via one or more video processors 528, which process the information to be displayed into a format suitable for the display(s) 526. The display(s) 526 can include any type of display, including but not limited to a cathode ray tube (CRT), a liquid crystal display (LCD), a plasma display, a light emitting diode (LED) display, etc.

Figure 6:
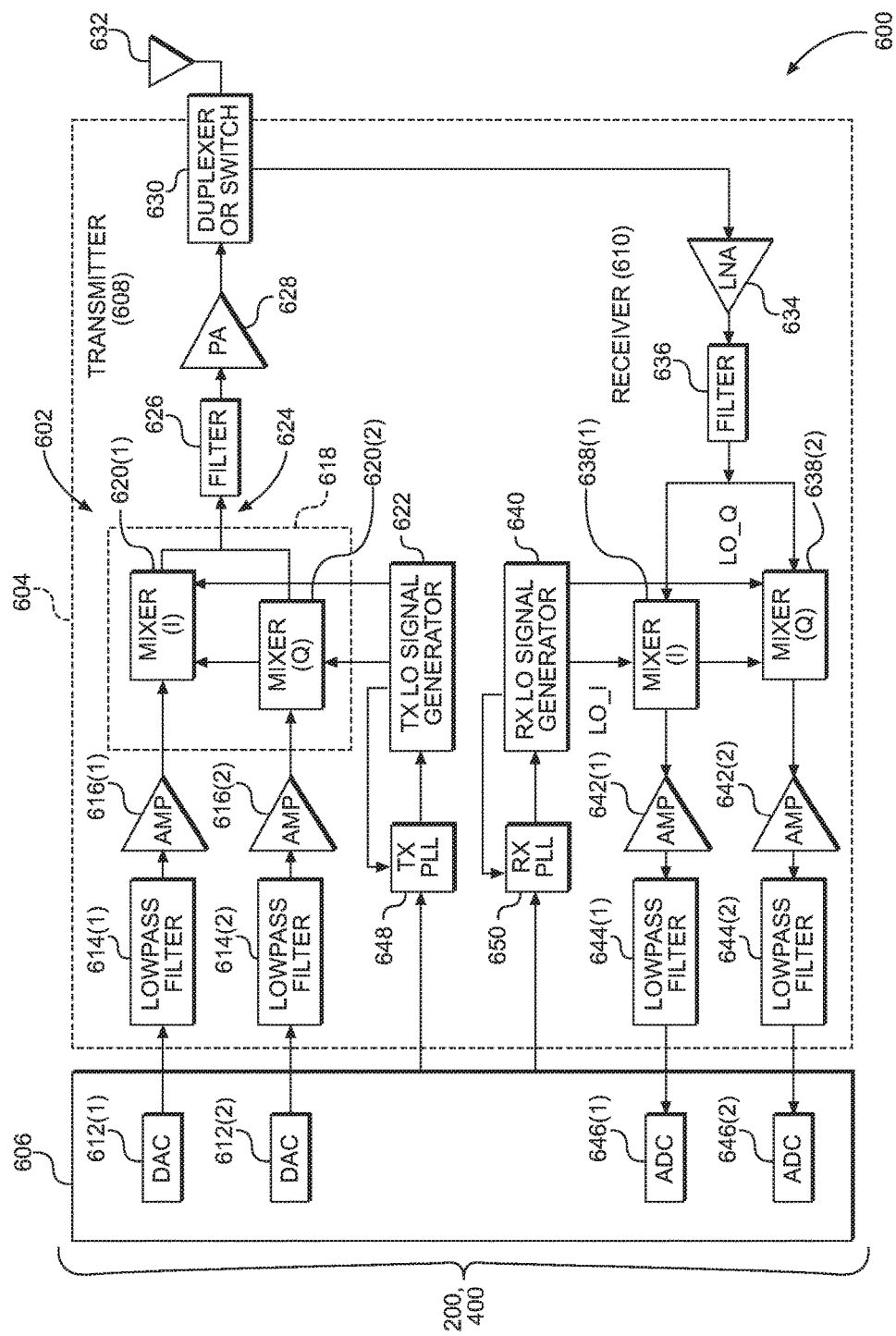
FIG. 6 is a block diagram of an exemplary wireless communications device that includes radio frequency (RF) components formed in an integrated circuit (IC), wherein the RF components can include elements employing the standard cell circuits employing high aspect ratio voltage rails for reduced resistance for reducing IR drop in FIGS. 2A-2B and 4A-4D.

FIG. 6 illustrates an exemplary wireless communications device 600 that includes radio frequency (RF) components formed in an integrated circuit (IC) 602, wherein the RF components can include elements employing the standard cell circuits 200, 400 employing the high aspect ratio voltage rails 202, 204, 402, 404 for reduced resistance in FIGS. 2A-2B and 4A-4D, respectively. In this regard, the wireless communications device 600 may be provided in the IC 602. The wireless communications device 600 may include or be provided in any of the above referenced devices, as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communication. In general, the wireless communications device 600 may include any number of transmitters and/or receivers for any number of communication systems and frequency bands. All or a portion of the transceiver 604 may be implemented on one or more analog ICs, RF ICs (RFICs), mixed-signal ICs, etc.

A transmitter 608 or a receiver 610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 610. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog-converters (DACs) 612(1), 612(2) for converting digital signals generated by the data processor 606 into the I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. Amplifiers (AMP) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals through mixers 620(1), 620(2) from a TX LO signal generator 622 to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by amplifiers (AMP) 642(1), 642(2) and further filtered by lowpass filters 644(1), 644(2) to obtain I and Q analog input signals, which are provided to the data processor 606. In this example, the data processor 606 includes analog-to-digital-converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A standard cell circuit, comprising:
   a plurality of metal layers disposed in parallel along a vertical axis;
   a first high aspect ratio voltage rail extending along a first longitudinal axis in a first direction perpendicular to the vertical axis and through at least one metal layer among the plurality of metal layers along the vertical axis, the first high aspect ratio voltage rail having a height-to-width ratio defined as a ratio between a respective height and a respective width of the first high aspect ratio voltage rail greater than 1.0 and configured to receive a first supply voltage;
   a second high aspect ratio voltage rail extending along a second longitudinal axis in the first direction substantially parallel to the first high aspect ratio voltage rail and through the at least one metal layer along the vertical axis, the second high aspect ratio voltage rail having a height-to-width ratio defined as a ratio between a respective height and a respective width of the second high aspect ratio voltage rail greater than 1.0; and
   a circuit device electrically coupled to the first high aspect ratio voltage rail and the second high aspect ratio voltage rail, wherein a voltage differential between the first high aspect ratio voltage rail and the second high aspect ratio voltage rail provides power to the circuit device.

2. The standard cell circuit of claim 1, further comprising one or more metal lines extending along one or more corresponding longitudinal axes different from the first longitudinal axis and the second longitudinal axis in the first direction substantially parallel to the first high aspect ratio voltage rail and the second high aspect ratio voltage rail, wherein:
  each metal line of the one or more metal lines has a width approximately equal to a critical dimension of a process technology of the standard cell circuit;
  the first high aspect ratio voltage rail has a width between approximately two (2) and three (3) times the width of each metal line of the one or more metal lines; and
  the second high aspect ratio voltage rail has a width approximately between two (2) and three (3) times the width of each metal line of the one or more metal lines.

3. The standard cell circuit of claim 2, wherein:
  the height-to-width ratio of the first high aspect ratio voltage rail is approximately equal to 4.0; and
  the height-to-width ratio of the second high aspect ratio voltage rail is approximately equal to 4.0.

4. The standard cell circuit of claim 2, wherein:
  the height-to-width ratio of the first high aspect ratio voltage rail is approximately equal to 3.0; and
  the height-to-width ratio of the second high aspect ratio voltage rail is approximately equal to 3.0.

5. The standard cell circuit of claim 2, wherein:
  the height-to-width ratio of the first high aspect ratio voltage rail is approximately equal to 2.0; and
  the height-to-width ratio of the second high aspect ratio voltage rail is approximately equal to 2.0.

6. The standard cell circuit of claim 1, further comprising one or more metal lines extending along one or more corresponding longitudinal axes different from the first longitudinal axis and the second longitudinal axis in the first direction substantially parallel to the first high aspect ratio voltage rail and the second high aspect ratio voltage rail, wherein:
  each metal line of the one or more metal lines has a width approximately equal to a critical dimension of a process technology of the standard cell circuit;
  the first high aspect ratio voltage rail has a width between approximately one (1) and two (2) times the width of each metal line of the one or more metal lines disposed in a metal layer; and
  the second high aspect ratio voltage rail has a width between approximately one (1) and two (2) times a critical dimension of a metal line of the one or more metal lines.

7. The standard cell circuit of claim 6, wherein:
  the height-to-width ratio of the first high aspect ratio voltage rail is approximately equal to 4.0; and
  the height-to-width ratio of the second high aspect ratio voltage rail is approximately equal to 4.0.

8. The standard cell circuit of claim 6, wherein:
  the height-to-width ratio of the first high aspect ratio voltage rail is approximately equal to 3.0; and
  the height-to-width ratio of the second high aspect ratio voltage rail is approximately equal to 3.0.

9. The standard cell circuit of claim 6, wherein:
  the height-to-width ratio of the first high aspect ratio voltage rail is approximately equal to 2.0; and
  the height-to-width ratio of the second high aspect ratio voltage rail is approximately equal to 2.0.

10. The standard cell circuit of claim 1, further comprising one or more metal lines extending along one or more corresponding longitudinal axes different from the first longitudinal axis and the second longitudinal axis in the first direction substantially parallel to the first high aspect ratio voltage rail and the second high aspect ratio voltage rail, wherein:
  each metal line of the one or more metal lines has a width approximately equal to a critical dimension of a process technology of the standard cell circuit;
  the first high aspect ratio voltage rail has a width approximately equal to the width of each metal line of the one or more metal lines disposed in a metal layer; and
  the second high aspect ratio voltage rail has a width approximately equal to the width of each metal line of the one or more metal lines.

11. The standard cell circuit of claim 10, wherein:
  the height-to-width ratio of the first high aspect ratio voltage rail is approximately equal to 4.0; and
  the height-to-width ratio of the second high aspect ratio voltage rail is approximately equal to 4.0.

12. The standard cell circuit of claim 10, wherein:
  the height-to-width ratio of the first high aspect ratio voltage rail is approximately equal to 3.0; and
  the height-to-width ratio of the second high aspect ratio voltage rail is approximately equal to 3.0.

13. The standard cell circuit of claim 10, wherein:
  the height-to-width ratio of the first high aspect ratio voltage rail is approximately equal to 2.0; and
  the height-to-width ratio of the second high aspect ratio voltage rail is approximately equal to 2.0.

14. The standard cell circuit of claim 1, wherein the second high aspect ratio voltage rail is configured to receive a second supply voltage.

15. The standard cell circuit of claim 1, wherein the second high aspect ratio voltage rail is electrically coupled to ground.

16. The standard cell circuit of claim 1 integrated into an integrated circuit (IC).

17. The standard cell circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. A standard cell circuit, comprising:
  a plurality of metal layers disposed in parallel along a vertical axis;
  a means for providing a first supply voltage to the standard cell circuit extending along a first longitudinal axis in a first direction perpendicular to the vertical axis and through at least one metal layer among the plurality of metal layers along the vertical axis, wherein the means for providing the first supply voltage has a height-to-width ratio defined as a ratio between a respective height and a respective width of the means for providing the first supply voltage greater than 1.0;
  a means for providing a second supply voltage to the standard cell circuit extending along a second longitudinal axis in the first direction substantially parallel to the means for providing the first supply voltage and through the at least one metal layer along the vertical axis, wherein the means for providing the second supply voltage has a height-to-width ratio defined as a ratio between a respective height and a respective width of the means for providing the second supply voltage greater than 1.0; and a means for providing a circuit function electrically coupled to the means for providing the first supply voltage and the means for providing the second supply voltage, wherein a voltage differential between the means for providing the first supply voltage and the means for providing the second supply voltage provides power to the means for providing the circuit function.

19. The standard cell circuit of claim 18, further comprising one or more means for transferring current extending along one or more corresponding longitudinal axes different from the first longitudinal axis and the second longitudinal axis in the first direction substantially parallel to the means for providing the first supply voltage and the means for providing the second supply voltage, wherein:

each means for transferring current of the one or more means for transferring current has a width approximately equal to a critical dimension of a process technology of the standard cell circuit;

the means for providing the first supply voltage has a width between approximately two (2) and three (3) times the width of each means for transferring current of the one or more means for transferring current; and the means for providing the second supply voltage has a width between approximately two (2) and three (3) times the width of each means for transferring current of the one or more means for transferring current.

20. The standard cell circuit of claim 18, further comprising one or more means for transferring current extending along one or more corresponding longitudinal axes different from the first longitudinal axis and the second longitudinal axis in the first direction substantially parallel to the means for providing the first supply voltage and the means for providing the second supply voltage, wherein:

each means for transferring current of the one or more means for transferring current has a width approximately equal to a critical dimension of a process technology of the standard cell circuit;

the means for providing the first supply voltage has a width between approximately one (1) and two (2) times the width of each means for transferring current of the one or more means for transferring current; and the means for providing the second supply voltage has a width between approximately one (1) and two (2) times the width of each means for transferring current of the one or more means for transferring current.

21. The standard cell circuit of claim 18, further comprising one or more means for transferring current extending along one or more corresponding longitudinal axes different from the first longitudinal axis and the second longitudinal axis in the first direction substantially parallel to the means for providing the first supply voltage and the means for providing the second supply voltage, wherein:

each means for transferring current of the one or more means for transferring current has a width approximately equal to a critical dimension of a process technology of the standard cell circuit;

the means for providing the first supply voltage has a width approximately equal to the width of each means for transferring current of the one or more means for transferring current; and the means for providing the second supply voltage has a width approximately equal to the width of each means for transferring current of the one or more means for transferring current.

22. A method for manufacturing a standard cell circuit employing high aspect ratio voltage rails for reduced resistance, comprising:

disposing a plurality of metal layers in parallel along a vertical axis;

disposing a first high aspect ratio voltage rail along a first longitudinal axis in a first direction perpendicular to the vertical axis and through at least one metal layer among the plurality of metal layers along the vertical axis, wherein the first high aspect ratio voltage rail has a height-to-width ratio defined as a ratio between a respective height and a respective width of first high aspect ratio voltage rail greater than 1.0 and is configured to receive a first supply voltage;

disposing a second high aspect ratio voltage rail extending along a second longitudinal axis in the first direction substantially parallel to the first high aspect ratio voltage rail and through the at least one metal layer along the vertical axis, wherein the second high aspect ratio voltage rail has a height-to-width ratio defined as a ratio between a respective height and a respective width of second high aspect ratio voltage rail greater than 1.0; and forming a circuit device that is electrically coupled to the first high aspect ratio voltage rail and the second high aspect ratio voltage rail, wherein a voltage differential between the first high aspect ratio voltage rail and the second high aspect ratio voltage rail provides power to the circuit device.

23. The method of claim 22, further comprising disposing one or more metal lines extending along one or more corresponding longitudinal axes different from the first longitudinal axis and the second longitudinal axis in the first direction substantially parallel to the first high aspect ratio voltage rail and the second high aspect ratio voltage rail, wherein each metal line of the one or more metal lines has a width approximately equal to a critical dimension of a process technology of the standard cell circuit.

24. The method of claim 23, wherein:

disposing the first high aspect ratio voltage rail comprises disposing the first high aspect ratio voltage rail having a width between approximately two (2) and three (3) times the width of each metal line of the one or more metal lines; and disposing the second high aspect ratio voltage rail comprises disposing the second high aspect ratio voltage rail having a width between approximately two (2) and three (3) times the width of each metal line of the one or more metal lines.

25. The method of claim 23, wherein:

disposing the first high aspect ratio voltage rail comprises disposing the first high aspect ratio voltage rail having a width between approximately one (1) and two (2) times the width of each metal line of the one or more metal lines; and disposing the second high aspect ratio voltage rail comprises disposing the second high aspect ratio voltage rail having a width between approximately one (1) and two (2) times the width of each metal line of the one or more metal lines.

26. The method of claim 23, wherein:

disposing the first high aspect ratio voltage rail comprises disposing the first high aspect ratio voltage rail having a width approximately equal to the width of each metal line of the one or more metal lines; and disposing the second high aspect ratio voltage rail comprises disposing the second high aspect ratio voltage rail having a width approximately equal to the width of each metal line of the one or more metal lines.

\* \* \* \* \*